(12) United States Patent
Kuo et al.

(10) Patent No.: US 9,099,676 B2
(45) Date of Patent: Aug. 4, 2015

(54) MIRROR ELECTROLUMINESCENT DISPLAY PANEL

(75) Inventors: Tzu-Yin Kuo, Hsin-Chu (TW); Hsing-Hung Hsieh, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 643 days.

(21) Appl. No.: 13/481,960

(22) Filed: May 29, 2012

(65) Prior Publication Data
US 2013/0049640 A1    Feb. 28, 2013

(30) Foreign Application Priority Data
Aug. 26, 2011   (TW) .............................. 100130702 A

(51) Int. Cl.
| H05B 37/00 | (2006.01) |
| H05B 39/00 | (2006.01) |
| H05B 41/00 | (2006.01) |
| H01L 51/52 | (2006.01) |

(52) U.S. Cl.
CPC .................... *H01L 51/524* (2013.01)

(58) Field of Classification Search
USPC ................................................. 315/312–325
See application file for complete search history.

(56) References Cited

U.S. PATENT DOCUMENTS

| 5,317,236 A * | 5/1994 | Zavracky et al. ............... 438/27 |
| 6,771,019 B1 * | 8/2004 | Wu et al. ........................ 313/503 |
| 7,719,187 B2 * | 5/2010 | Ray et al. ....................... 313/509 |
| 7,791,037 B1 * | 9/2010 | Wedding et al. ............... 250/374 |
| 8,420,416 B2 * | 4/2013 | Naito et al. ..................... 438/29 |
| 2005/0195345 A1 | 9/2005 | Chiang et al. |
| 2011/0017987 A1 * | 1/2011 | Naito et al. ..................... 257/40 |
| 2011/0273080 A1 * | 11/2011 | Kimura et al. ................ 313/498 |

FOREIGN PATENT DOCUMENTS

| CN | 101059738 A | 10/2007 |
| JP | 200386358 A | 3/2003 |
| JP | 2007322780 A | 12/2007 |
| TW | I249054 | 2/2006 |
| TW | I252445 | 4/2006 |

* cited by examiner

*Primary Examiner* — Brandon S Cole
(74) *Attorney, Agent, or Firm* — Winston Hsu; Scott Margo

(57) ABSTRACT

A mirror electroluminescent display panel includes an array substrate, a plurality of driving devices, a plurality of electroluminescent devices, and a cover substrate. The driving devices and the electroluminescent devices are disposed on the array substrate. Each electroluminescent device includes a first electrode electrically connected to the corresponding driving device, a light-emitting layer disposed on the first electrode, and a second electrode disposed on the light-emitting layer. The cover substrate and the array substrate are disposed oppositely. The cover substrate has a plurality of transmission regions, and a reflection region disposed between adjacent transmission regions, and each of the transmission regions is corresponding to each of the light-emitting layers, respectively.

12 Claims, 5 Drawing Sheets

MIRROR ELECTROLUMINESCENT DISPLAY PANEL

BACKGROUND OF THE INVENTION

1. Field of the Invention

The present invention relates to a mirror electroluminescent display panel, and more particularly, to a mirror electroluminescent display panel with high brightness and low color aberration.

2. Description of the Prior Art

In some certain applications, the display panel is provided with mirror effect. The mirror effect of a conventional display panel is implemented by bonding a reflective film to the entire display surface of the display panel. The reflective film is able to reflect ambient light, which makes the display panel look like a mirror in appearance, while the light emitted by the display panel can penetrate through the reflective film so the user can see the images. Despite a portion of light emitted by the display panel would pass through the reflective film, another portion of light emitted by the display panel would be absorbed or reflected by the reflective film, which causes light loss and therefore reduces the brightness of images. In addition, the transmission rate of the reflective film with respect to light of different colors is different, and that generates color aberration (color shift) in displaying. Therefore, the display quality of conventional mirror display panel needs to be improved.

SUMMARY OF THE INVENTION

It is therefore one of the objectives of the present invention to provide a mirror electroluminescent display panel to increase brightness and diminish color aberration of display images.

According to a preferred embodiment of the present invention, a mirror electroluminescent display panel is provided. The mirror electroluminescent display panel includes an array substrate, a plurality of driving devices, a plurality of electroluminescent devices, and a cover substrate. The driving devices and the electroluminescent devices are disposed on the array substrate. Each electroluminescent device includes a first electrode electrically connected to the corresponding driving device, a light-emitting layer disposed on the first electrode, and a second electrode disposed on the light-emitting layer. The cover substrate and the array substrate are disposed oppositely. The cover substrate has a plurality of transmission regions, and a reflection region disposed between a region between adjacent transmission regions. Each of the transmission regions is corresponding to each of the light-emitting layers, respectively.

The cover substrate of the mirror electroluminescent display panel of the present invention has the transmission regions corresponding to the light-emitting layers, and the transmission regions allow light emitted by the light-emitting layers passing through without loss. Consequently, the mirror electroluminescent display panel of the present invention can display images with high brightness and without color aberration. The reflection region of the cover substrate can reflect the ambient light to provide mirror effect.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
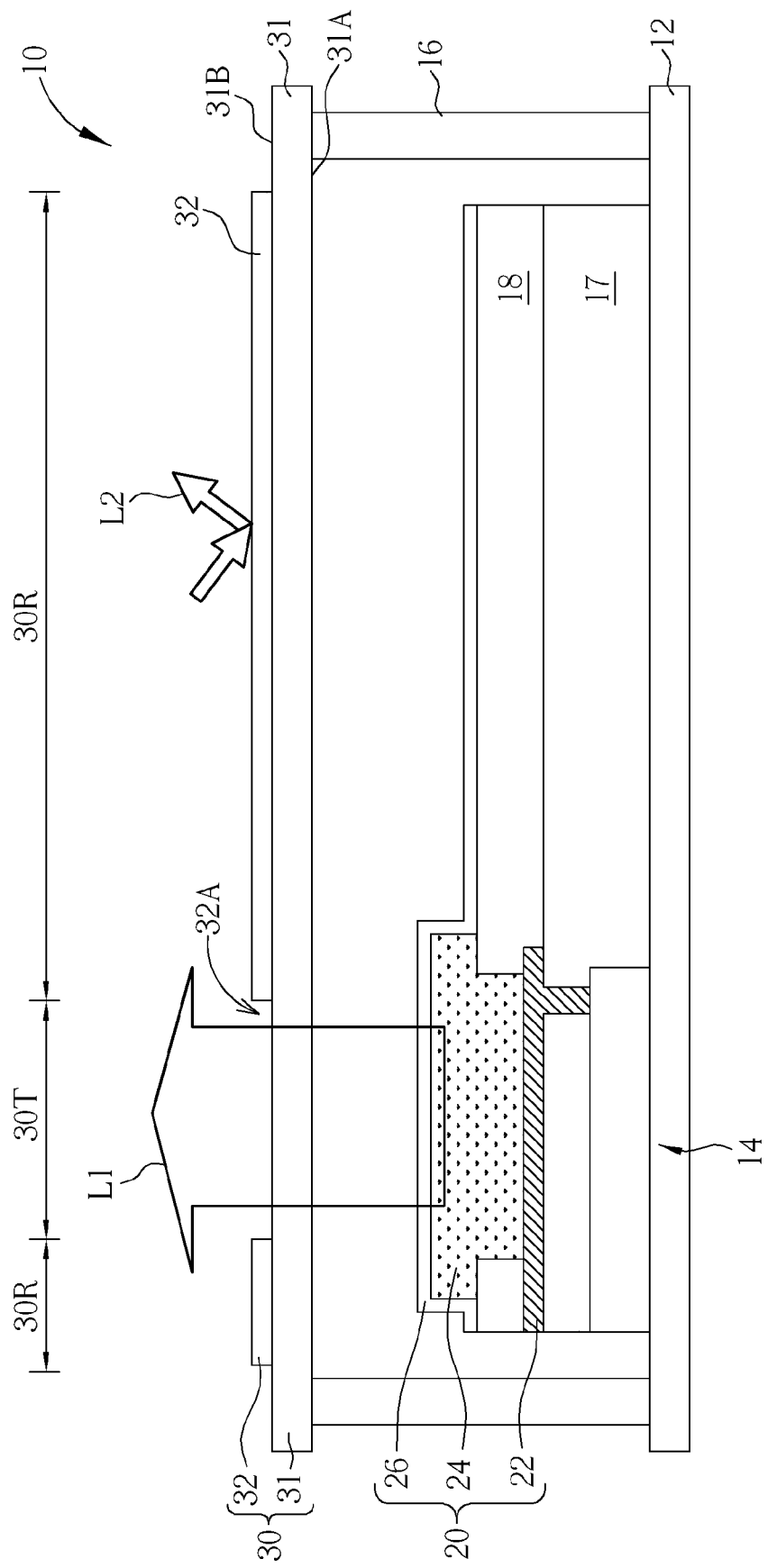
FIG. 1 is a cross-sectional view of a mirror electroluminescent display panel according to a first preferred embodiment of the present invention.
Figure 2:
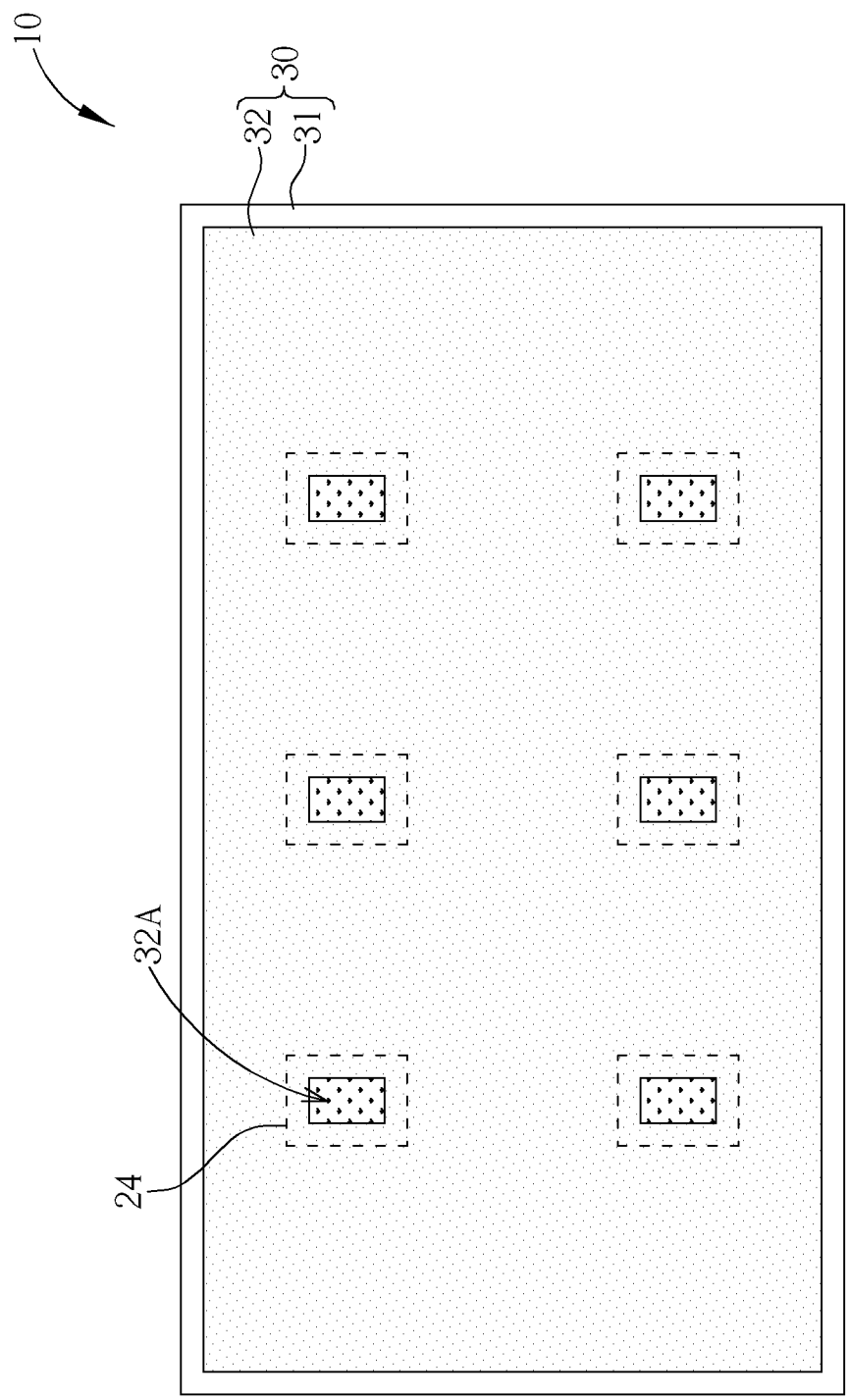
FIG. 2 is a top view of a mirror electroluminescent display panel according to a first preferred embodiment of the present invention.

Please refer to FIG. 1 and FIG. 2. FIG. 1 is a cross-sectional view of a mirror electroluminescent display panel according to a first preferred embodiment of the present invention, and FIG. 2 is a top view of a mirror electroluminescent display panel according to a first preferred embodiment of the present invention. It is appreciated that some components of the electroluminescent display panel are not shown in FIG. 2. As shown in FIG. 1 and FIG. 2, the mirror electroluminescent display panel 10 includes an array substrate 12, a plurality of driving devices 14, a plurality of electroluminescent devices 20, and a cover substrate 30. The driving devices 14 are disposed on the array substrate 12, and the driving devices 14 may be, for instance, thin film transistor (TFT) devices, but not limited thereto. The electroluminescent devices 20 are disposed on the array substrate 12, and the electroluminescent device 20 may be, for instance, organic light-emitting diode (OLED) devices, but not limited thereto. In this embodiment, each electroluminescent device 20 is disposed on and substantially corresponding to each driving device 14, but not limited thereto. Each electroluminescent device 20 includes a first electrode 22, a light-emitting layer 24 and a second electrode 26. The first electrode 22 is disposed on a first passivation layer 17, and electrically connected to the corresponding driving device 14. The first passivation layer 17 is covered by a second passivation layer 18, and the second passivation layer 18 exposes the first electrode 22. The light-emitting layer 24 is disposed on the first electrode 22, and the second electrode 26 is disposed on the light-emitting layer 24. In this embodiment, the first electrode 22 is an anode, and the second electrode 26 is a cathode. The first electrode 22 is preferably a reflection electrode e.g. a metal electrode, so as to reflect light emitted by the light-emitting layer 24 for increasing light utilization, while the second electrode 26 is a transmission electrode, which allows light passing through. The light-emitting layer 24 may be, for example, an organic light-emitting layer, and the material of the light-emitting layer 24 may be selected from, for instance, red light-emitting material, green light-emitting material or blue light-emitting material based on the color of light to be generated. The cover substrate 30 and the array substrate 12 are disposed oppositely, and bonded by a sealant 16. The cover substrate 30 has a plurality of transmission regions 30T and a reflection region 30R disposed between the adjacent transmission regions 30T. Each transmission region 30T is substantially corresponding to each electroluminescent device 20, while the reflection region 30R is corresponding to the region between the adjacent electroluminescent devices 20. For example, each transmission region 30T of the cover substrate 30 is substantially corresponding to the light-emitting layer 24 of each electroluminescent device 20, respectively.

In this embodiment, the cover substrate 30 includes a transparent base 31 and a patterned reflective film 32. The transparent base 31 is base having transparent property such as glass base or plastic base, but not limited thereto. The transparent base 31 has an inner surface 31A and an outer surface 31B, where the inner surface 31A is adjacent to and facing the array substrate 12, while the outer surface 31B is away from and opposite to the array substrate 12. In this embodiment, the patterned reflective film 32 is disposed on the outer surface 31B of the transparent base 31. The patterned reflective film 32 has a plurality of openings 32A, which allow light passing through and thus form the transmission regions 30T of the cover substrate 30. Each opening 32A is substantially corresponding to each light-emitting layer 24, and the size of the opening 32A is preferably smaller than or equal to the size of the first electrode 22. Specifically, since the transmission regions 30T of the cover substrate 30 is implemented by the openings 32A of the patterned reflective film 32, each transmission region 30T of the cover substrate 30 is substantially corresponding to each first electrode 22, and the size of the transmission region 30T is smaller than or equal to the size of the first electrode 22. In this embodiment, the patterned reflective film 32 may be formed on the transparent base 31 by a deposition process. The deposition process may be a physical vapor deposition (PVD) process e.g. an evaporation process or a sputtering process, or a chemical vapor deposition (CVD) process, but not limited thereto. The patterned reflective film 32, for example, may also be formed on the transparent base 31 by other deposition process such as coating, inkjet printing and bonding. In addition, the material of the patterned reflective film 32 may be various kinds of materials with high reflectivity, e.g. metal, but not limited thereto. The openings 32A of the patterned reflective film 32 may be formed by a patterning process such as photolithography and etching process, but not limited thereto. For example, the patterned reflective film 32 with openings 32A may be formed simultaneously by inkjet printing or bonding.

As shown in FIG. 1, the openings 32A of the patterned reflective film 32 are corresponding to the light-emitting layers 24 respectively, and thus when displaying, the light L1 emitted by the light-emitting layer 24 will all pass through the opening 32A without loss. Consequently, the mirror electroluminescent display panel 10 may display images with high brightness and without color aberration. In another aspect, the ambient light L2 is reflected by the patterned reflective film 32 to exhibit mirror effect. The transmission regions 30T of the cover substrate 30 allow light passing through, while the reflection region 30R allows light reflecting but does not allow light transmitting. In this embodiment, the transmission regions 30T and the reflection region 30R are formed by the transparent base 31 and the patterned reflective film 32, but not limited thereto. For example, the transmission regions 30T and the reflection region 30R may be formed by using a reflective material as the material of the cover substrate 30 and forming openings in the cover substrate 30.

The mirror electroluminescent display panel is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 3:
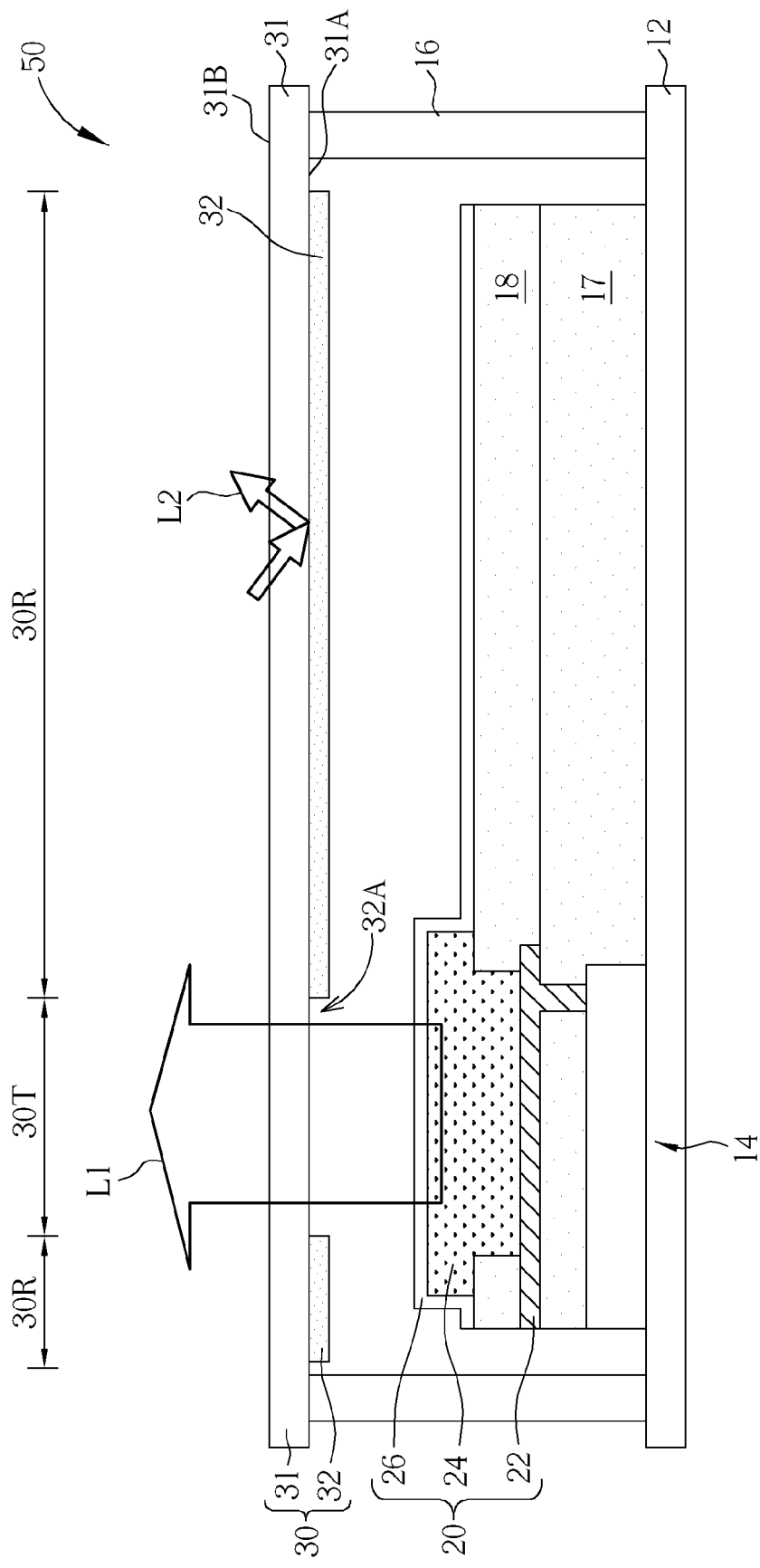
FIG. 3 is a cross-sectional view of a mirror electroluminescent display panel according to a second preferred embodiment of the present invention.

Please refer to FIG. 3. FIG. 3 is a cross-sectional view of a mirror electroluminescent display panel according to a second preferred embodiment of the present invention. As shown in FIG. 3, different from the first preferred embodiment, in this embodiment, the patterned reflective film 32 of the mirror electroluminescent display panel 50 is disposed on the inner surface 31A of the transparent base 31.

Figure 4:
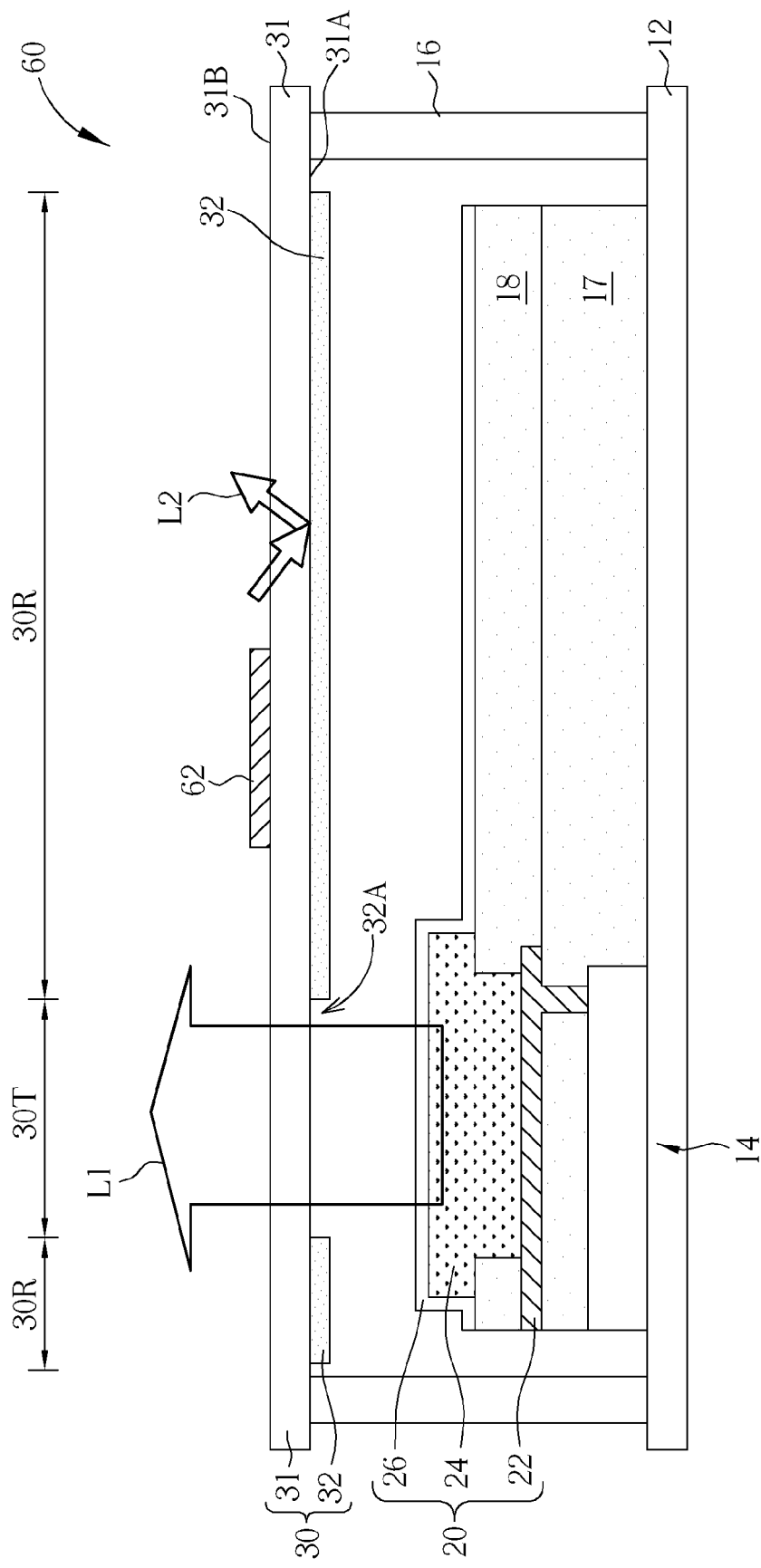
FIG. 4 is a cross-sectional view of a mirror electroluminescent display panel according to a third preferred embodiment of the present invention.

Please refer to FIG. 4. FIG. 4 is a cross-sectional view of a mirror electroluminescent display panel according to a third preferred embodiment of the present invention. As shown in FIG. 4, in this embodiment, the patterned reflective film 32 of the mirror electroluminescent display panel 60 is also disposed on the inner surface 31A of the transparent base 31. What is different from the second preferred embodiment is that the mirror electroluminescent display panel 60 further includes at least one touch sensing layer 62 disposed on the outer surface 31B of the transparent base 31 for providing touch input function. The touch sensing layer 62 may be various types of touch sensing layer such as capacitive type touch sensing layer, resistive type touch sensing layer or optical type touch sensing layer. In addition, it is preferable that the touch sensing layer 62 does not overlap the opening 32A of the patterned reflective film 32 to avoid adversely affecting display images of the mirror electroluminescent display panel 60.

Figure 5:
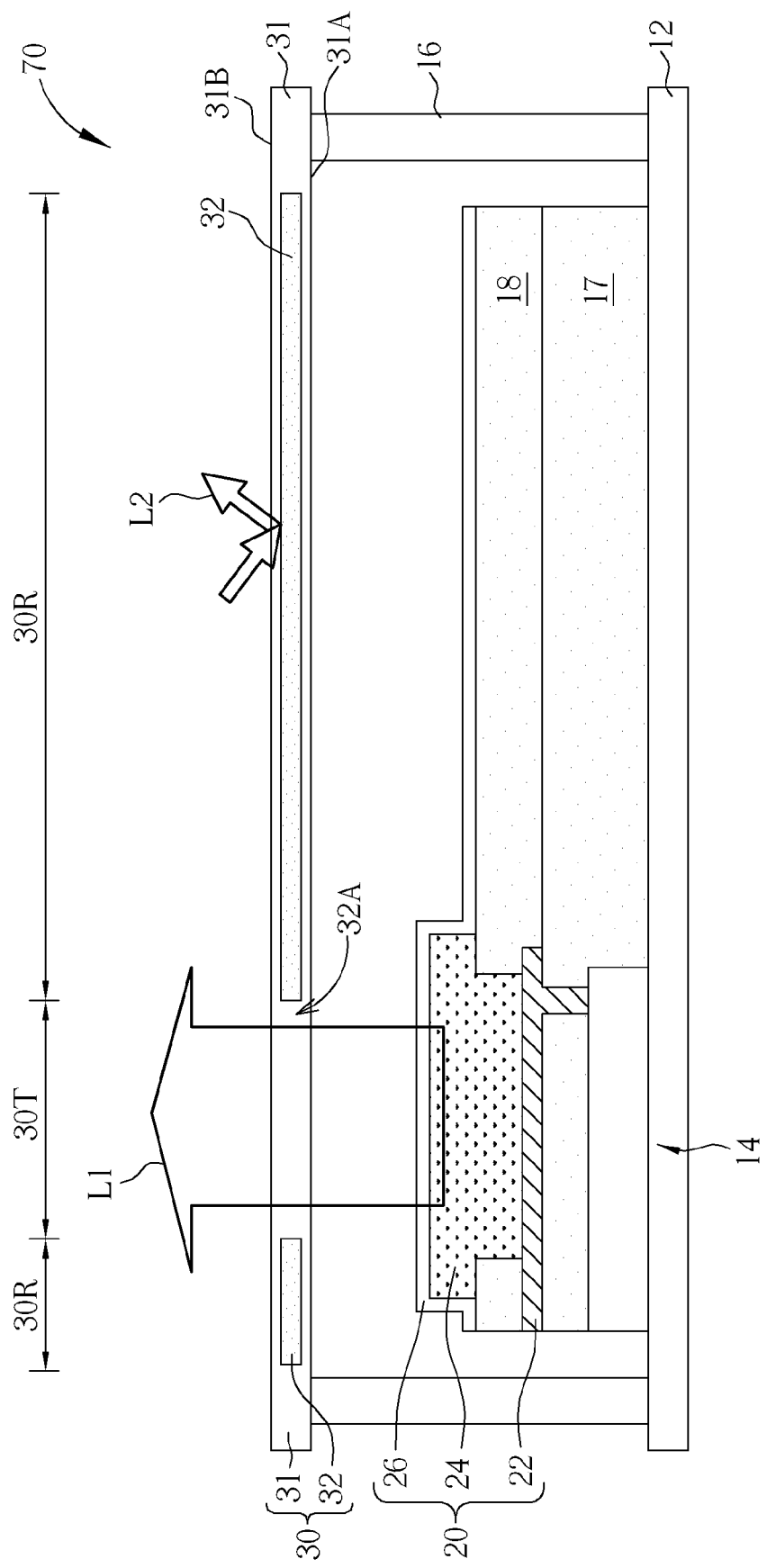
FIG. 5 is a cross-sectional view of a mirror electroluminescent display panel according to a fourth preferred embodiment of the present invention.

Please refer to FIG. 5. FIG. 5 is a cross-sectional view of a mirror electroluminescent display panel according to a fourth preferred embodiment of the present invention. As shown in FIG. 5, different from the first preferred embodiment, in this embodiment, the patterned reflective film 32 of the mirror electroluminescent display panel 70 is disposed inside the transparent base 31, i.e. the patterned reflective film 32 is embedded in the transparent base 31. In addition, a touch sensing layer (not shown) may be optionally disposed on the outer surface 31B of the transparent base 31 for providing touch input function as disclosed in the third preferred embodiment.

In conclusion, the cover substrate of the mirror electroluminescent display panel of the present invention has the transmission regions corresponding to the light-emitting layers, and the transmission regions allow light emitted by the light-emitting layers passing through without loss. Consequently, the mirror electroluminescent display panel of the present invention can display images with high brightness and without color aberration. The reflection region of the cover substrate can reflect the ambient light to provide mirror effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A mirror electroluminescent display panel, comprising:
 an array substrate;
 a plurality of driving devices, disposed on the array substrate;
 a plurality of electroluminescent devices, disposed on the array substrate, each of the electroluminescent devices comprising:

a first electrode, electrically connected to the corresponding driving device;
a light-emitting layer, disposed on the first electrode; and
a second electrode, disposed on the light-emitting layer;
a cover substrate, disposed opposite to the array substrate, the cover substrate having a plurality transmission regions, and a reflection region disposed between adjacent transmission regions, wherein each of the transmission regions is substantially corresponding to each of the light-emitting layers.

2. The mirror electroluminescent display panel of claim 1, wherein each of the transmission regions of the cover substrate is substantially corresponding to each of the first electrode.

3. The mirror electroluminescent display panel of claim 2, wherein a size of each of the transmission regions of the cover substrate is substantially smaller than or equal to that of the first electrode.

4. The mirror electroluminescent display panel of claim 1, wherein the cover substrate comprises a transparent base and a patterned reflective film, the patterned reflective film is substantially corresponding to the reflection region of the cover substrate, and the patterned reflective film has a plurality of openings substantially corresponding to each of the transmission regions of the cover substrate.

5. The mirror electroluminescent display panel of claim 4, wherein the patterned reflective film is formed on transparent base by a deposition process.

6. The mirror electroluminescent display panel of claim 4, wherein the transparent base has an inner surface and an outer surface, the inner surface faces the array substrate, and the outer surface is opposite to the array substrate.

7. The mirror electroluminescent display panel of claim 6, wherein the patterned reflective film is disposed on the outer surface of the transparent base.

8. The mirror electroluminescent display panel of claim 6, wherein the patterned reflective film is disposed on the inner surface of the transparent base.

9. The mirror electroluminescent display panel of claim 6, wherein the patterned reflective film is disposed inside the transparent base.

10. The mirror electroluminescent display panel of claim 6, further comprising at least one touch sensing layer disposed on the outer surface of the cover substrate.

11. The mirror electroluminescent display panel of claim 1, wherein the first electrode comprises a reflection electrode, and the second electrode comprises a transparent electrode.

12. A mirror electroluminescent display panel, comprising:
an array substrate;
a plurality of electroluminescent devices, disposed on the array substrate; and
a cover substrate, disposed opposite to the array substrate, the cover substrate having a reflection region and a plurality of transmission regions, wherein each of the transmission regions is substantially corresponding to each of the electroluminescent devices, and the reflection region is substantially corresponding to a region between the adjacent electroluminescent devices.

* * * * *